United States Patent [19]

Richards, Jr.

[11] Patent Number: 4,580,287
[45] Date of Patent: Apr. 1, 1986

[54] RADIO RECEIVER WITH LOGARITHMIC SIGNAL STRENGTH DETECTOR

[75] Inventor: Oliver L. Richards, Jr., N. Grosvenor Dale, Conn.

[73] Assignee: Sprague Electric Company, North Adams, Mass.

[21] Appl. No.: 593,156

[22] Filed: Mar. 26, 1984

[51] Int. Cl.⁴ .................. H04B 17/00; H04B 1/16
[52] U.S. Cl. .................... 455/226; 455/234; 455/241; 455/245; 455/253; 330/254; 330/257
[58] Field of Search ............... 455/154, 219, 226, 234, 455/239, 240, 241, 245, 247, 251, 253; 330/254, 257, 278, 279, 288; 324/57 N

[56] References Cited

U.S. PATENT DOCUMENTS

| | | |
|---|---|---|
| 2,548,913 | 4/1951 | Schreiner et al. |
| 3,774,113 | 11/1973 | Chasek ........................... 455/249 |
| 3,835,378 | 9/1974 | Edden et al. ..................... 455/234 |
| 3,940,708 | 2/1976 | Sumi et al. ....................... 330/254 |
| 4,065,725 | 12/1977 | Lillis et al. ....................... 330/254 |
| 4,143,331 | 3/1979 | Page ................................ 455/219 |
| 4,186,351 | 1/1980 | Brefini et al. |
| 4,339,728 | 7/1982 | Monticelli ........................ 455/234 |
| 4,492,926 | 1/1985 | Kusakabe et al. ................. 330/278 |

Primary Examiner—Jin F. Ng

[57] ABSTRACT

A radio receiver has one or more automatic gain control (AGC) circuits that each generate the gain-determining bias current in a separate main channel section or sections, e.g. RF amplifier, mixer, IF amplifier, of the radio receiver. The receiver is for the most part formed in an integrated silicon circuit, wherein the gain-controlling current in each case biases the base-emitter junction of an amplifying grounded-emitter transistor so that the gain thereof is directly proportional to the magnitude of the AGC control current. That current in each case is caused to flow through a diode string to generate a voltage drop thereacross that is logarithmic function of the AGC control current as well as of the radio signal amplitude at the input of the AGC controlled section. The sum of those diode voltages may be taken to produce a log of the product of the gains of the AGC controlled sections. Thus a sum signal is a logarithmic function of the radio signal input to the receiver.

7 Claims, 8 Drawing Figures

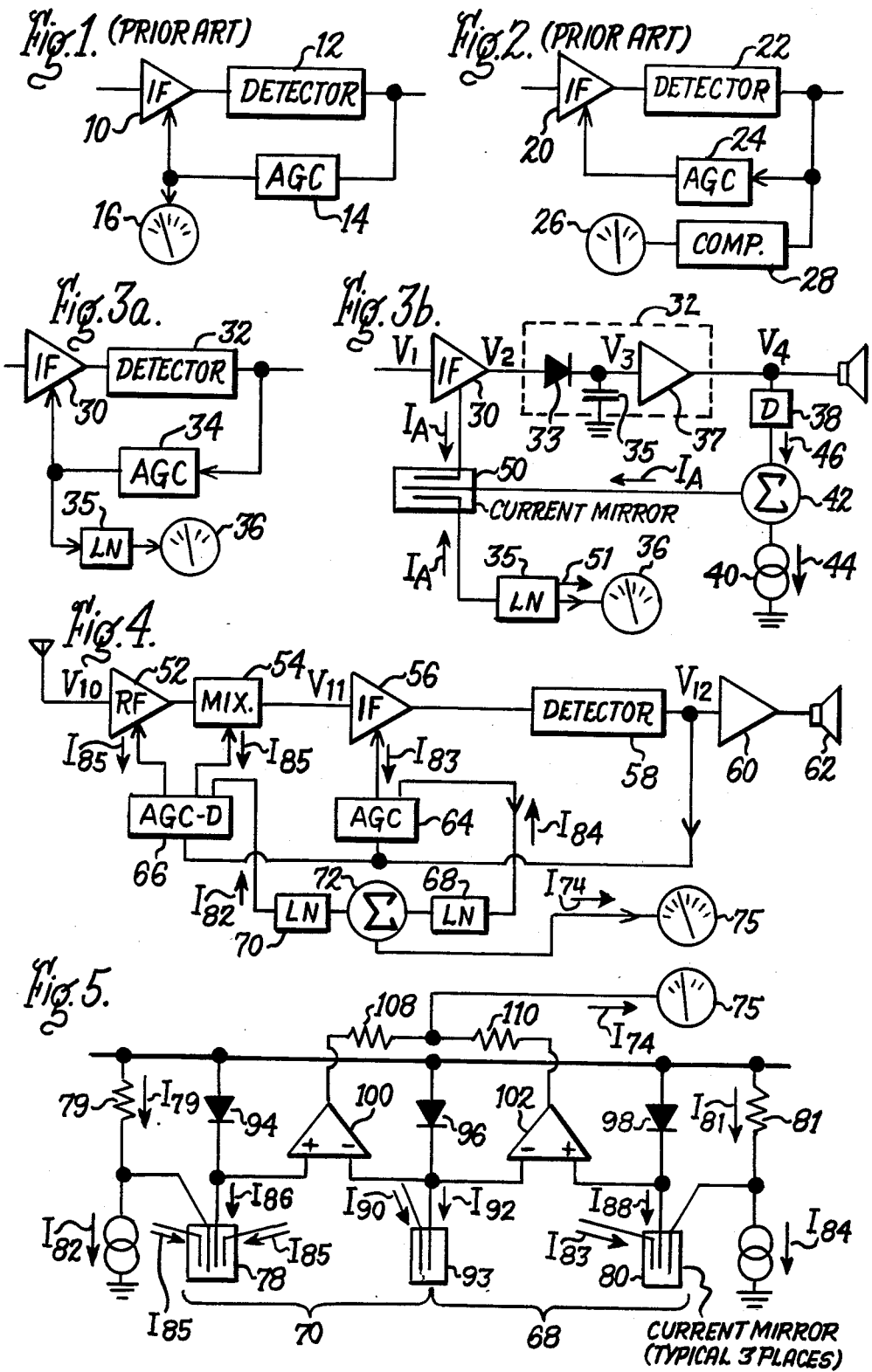

RADIO RECEIVER WITH LOGARITHMIC SIGNAL STRENGTH DETECTOR

BACKGROUND OF THE INVENTION

This invention relates to a radio receiver having an automatic gain control (AGC) circuit controlling the gain of at least an intermediate frequency (IF) stage and having a logarithmic generating circuit for providing an output signal that is a logarithm of the AGC signal that is applied directly to the IF stage.

It is well known to employ an AGC circuit in a radio receiver to automatically adjust the gain in one or more of the amplifier stages so as to keep the radio output signal at about the same level while the amplitude of the incoming radio signal may vary over many orders of magnitude. Normally the AGC circuit does not begin to attenuate the IF radio signal until the incoming radio signal exceeds an amplitude substantially greater than the usual background noise. This AGC threshold action is designed to occur only for radio signals that are strong enough to provide good quality radio reception, i.e. clear noise free sound. Beyond that "minimum strength" radio signal, the AGC control signal (voltage or current) is adjusted so that the IF stage is biased to operate in its optimum mode of highest gain without unwanted overdriving and saturation.

If the radio signal strength increases even further, then the AGC signal increases to hold the output of the IF stage essentially constant. The AGC signal as a function of radio signal strength is quite nonlinear.

A second AGC circuit is often provided to control the gain of the RF stages, usually including the mixer stage. This second AGC circuit usually has an even higher action threshold, and a greater delay.

Thus not only are there many sources of nonlinearity in these radio gain controlling circuits, but no one gain controlling signal contains all the information from which the strength of the incoming radio signal can be deduced.

Now it was recognized long ago that for providing a visual indication of radio signal strength, it would be desirable to progressively compress the indicator signal more and more as the radio signal strength rises higher and higher. Attempts to effect such compression have led to signal strength meter circuits that are very roughly logarithmic. Such circuits are normally located at the input to or at an intermediate position within the AGC circuitry.

There is a need for a logarithmic signal strength indicator circuit that covers about four decades of medium to high radio-signal strength, e.g. antenna voltages from 10 to 100,000 $\mu v$ (micro volts), especially for use in mobile cellular narrow-band FM radio receivers and in stereo AM receivers. During operation a cellular radio receiver periodically samples the signal from the nearby cellular radio transmitters and compares their signal strengths to determine which is strongest (at least 6 db greater than the others). The receiver automatically communicates with the station having the strongest signal. To make such a signal strength comparison of two signals near 10 $\mu v$ with the same accuracy that a comparison of two signals at 100,000$\mu$ volts are made is difficult and is believed never to have been done before. Such a system would also provide a superior radio-signal strength indicator for monitoring a wide range of medium to high strength signals or for stopping tune scanners.

It is therefore a primary object of this invention to provide a circuit that provides an output that is an accurate logarithm of the input signal over a wide range of signal amplitudes.

It is a further object of this invention to provide a logarithm (LN) circuit that provides two (or more) outputs that are accurate logarithms of two (or more) input signals respectively, and which circuit sums the two (or more) output signals to provide the LN of the product of the two (or more) input signals.

It is further an object of this invention to provide such a circuit in a radio wherein the two circuit input signals are the outputs from an IF AGC circuit and RF AGC circuit respectively so that the sum of the LN circuit outputs is essentially a LN function of the incoming radio signal.

SUMMARY OF THE INVENTION

A radio receiver has an AGC circuit means for altering the gain of at least a portion of the receiver to maintain the amplitude of the radio's output signal substantially constant for a wide range of radio-inputsignal amplitudes. The AGC circuit means is further for generating a control signal for so controlling the receiver gain that the gain is a linear function of the AGC control signal amplitude. According to one aspect of this invention the receiver includes a logarithmic function generator that produces an output signal having an amplitude that is a logarithmic function of the AGC control signal amplitude. This has the immediate effect that the logarithmic function generator output signal is also a logarithmic funtion of the radio signal at the input to the gain controlled portion of the radio.

Furthermore, when separate AGC circuits are used, e.g. one for control of gain of the RF section and another for the IF section, a logarithmic function generator follows each of the AGC circuits and thus logarithmic function generators produce signals that are summed in a summing network to produce a signal that is a logarithm of the product of the gains of the separately AGC controlled portions of the radio. Thus the summing network output signal is a radio signal strength indicating signal that is a logarithmic function of the radio signal appearing at the input of the receiver.

BRIEF DESCRIPTION OF THE DRAWINGS

FIG. 1 shows a block diagram of a portion of a prior art radio receiver having a signal strength indicating meter.

FIG. 2 shows a block diagram of a portion of a prior art radio receiver having signal strength indicating meter with a signal compression feature.

FIG. 3(a) shows a block diagram of a portion of a radio of this invention having a signal strength indicating meter.

FIG. 3(b) shows a more detailed block diagram of the radio in FIG. 3(a).

FIG. 4 shows a block diagram of a portion of another radio receiver of this invention having a signal strength indicating meter.

FIG. 5 shows a block diagram of the radio signal indicating portion of the radio of FIG. 4 to show greater structural detail.

DESCRIPTION OF THE PREFERRED EMBODIMENTS

Figure 6:
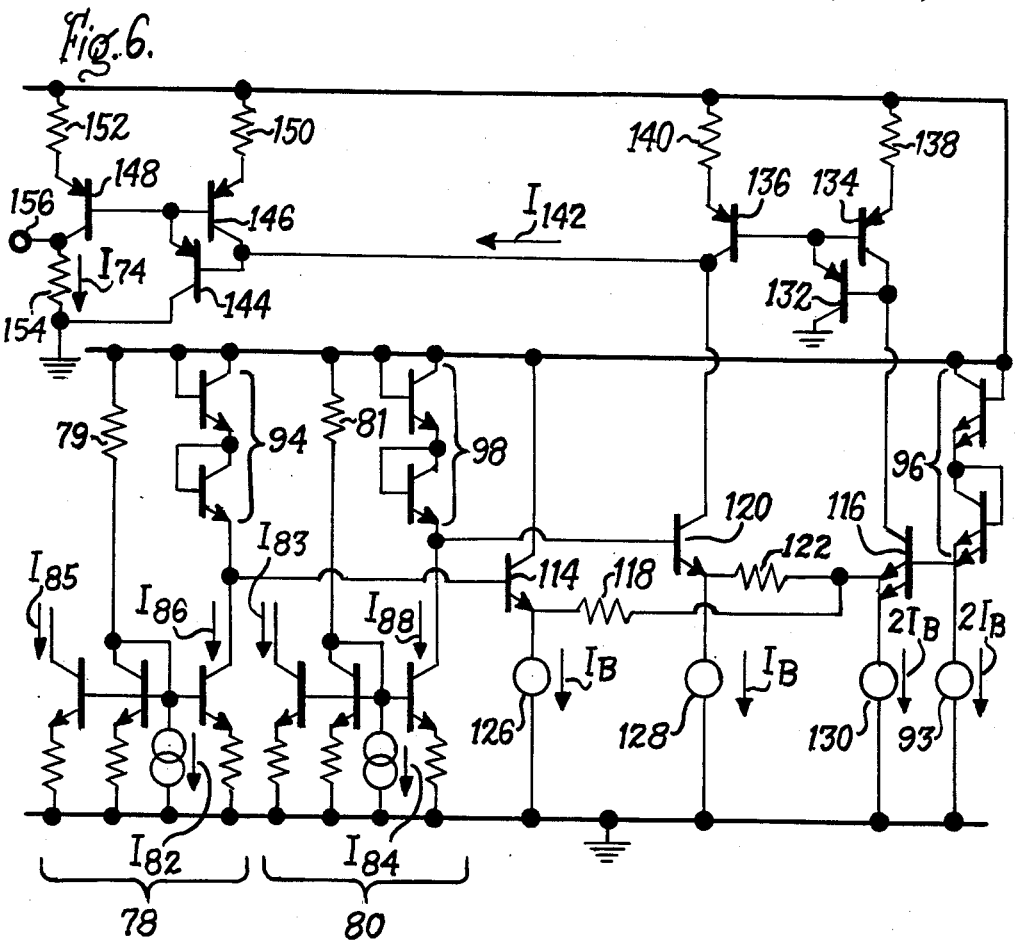
FIG. 6 shows a circuit diagram illustrating in even more detail how the circuit portion of FIG. 5 may be implemented.

The prior art superheterodyne radio partially illustrated in FIG. 1 has an IF amplifier 10 followed by a detector 12 that provides an intermediate control signal whose level varies directly as the amplitude of the output signal from the IF amplifier 10. The detector 12 may be an AM detector that consists simply of a series connected diode followed by a shunting capacitor (not shown). That is a well known peak detector circuit whose average output voltage, or level, is proportional to the IF amplifier output voltage.

When the radio is realized at least for the most part as an integrated circuit, the AGC circuit 14 usually produces a control current at a control point in the IF amplifier 10 to effect a change of IF amplifier gain that is directly proportional to the AGC control current.

The meter 16 is usually a simple D'Arsonval meter having a needle deflection that is directly related to the meter current. The same or a proportional current to the AGC current flows through meter 16 so that there is little meter deflection until the radio signal strength exceeds that necessary to stimulate major action of the AGC circuit 14 towards the stabilization of the IF amplifier output signal.

The prior art superheterodyne radio partially illustrated in FIG. 2 is constructed of a similar IF amplifier 20, detector 22 and AGC circuit 24, but the radio signal strength meter 26 is connected via a signal compressing circuit 28. Such circuits have the disadvantage that for radio signal strengths greater than that for which the IF amplifier output amplitude has just been stabilized by AGC action, there is little further change in the meter current and meter deflection.

In the following examples of radio circuits of this invention, the radio signal strength indicating systems are capable of covering the range of radio signal amplitudes both below and above that "just - stabilizing" amplitude of the incoming radio signal. In other words, in radios of this invention the signal-strength indicating signal system is effective over the entire range of incoming signals for which the AGC system is active, generally three or four decades of signal strength.

Referring now to the radio of FIG. 3(a), there is an IF amplifier 30, a detector 32, and an AGC circuit 34 connected in the conventional manner. However, there is a logarithmic function generator 35 having the same input signal as that provided to the gain-controlling point in the IF amplifier 20. The logarithmic function generator output signal drives the meter 36.

The more elaborate diagramatic representation of the FIG. 3(a) radio of FIG. 3(b) shows several functional circuit blocks that may make up the AGC circuit including a delay circuit 38 that includes a low pass filter to remove the audio components and a signal threshold establishing circuit determining the above noted AGC delay function. The AGC circuit further includes a constant current reference generator 40 and a summing circuit 42 that in this case produces an AGC current $I_A$ that is actually the difference between the reference current $I_{44}$ and the current $I_{46}$ from the delay circuit 38. Thus when the level of the detector output signal $V_4$ increases the intermediate control current $I_{46}$ increases and the AGC output current $I_A$ decreases according to $$I_A = I_{44} - I_{46} \text{ or}$$
$$= K_1 - I_{46}$$

The gain $G_{IF}$ of the integrated circuit IF amplifier 30 is directly dependent upon the emitter bias current of one or more of the amplifying transistors (not shown) and the AGC control current $I_A$ supplies that bias current;

$$G_{IF} = \frac{|V_2|}{|V_1|} = K_2 I_A$$

where $K_2$ is another constant.

Also the intermediate control current $I_{46}$ is directly proportional to the amplitude of the IF amplifier output signal $|V_2|$;

$$I_{46} = K_3 |V_2|$$

where $K_3$ is yet another constant.

Combining the above, $$I_A = \frac{K_1}{1 + K_4 V_1}$$

where $K_4 = K_3 K_2$.

A current mirror 50 delivers currents of magnitude $I_A$ for biasing and controlling the gain of the IF amplifier and as the signal of which LN function generator 35. At the output of generator 35 there is provided a radio-signal indicator signal 51 that drives the meter 36.

$$I_{51} = LN(K_1) - LN(1 + K_4 V_1)$$

In practice $K_4 V_1$ is much greater than unity for the above noted radio signal amplitudes of interest here. Therefore the current $I_{51}$ is the logarithm of the radio-signal input $V_1$ to the IF amplifier 30 for values of $V_1$ for which $|V_4|$ is held constant by AGC action.

The detector 32 includes a series connected diode 33 and a shunt capacitor 35 followed by a DC audio amplifier 37.

The radio in FIG. 4 includes the tandem connected circuits, RF amplifier 52, mixer 54, IF amplifier 56, detector 58, audio amplifier 60, and speaker 62. An AGC circuit 64 holds the intermediate control voltage amplitude $|V_{12}|$ substantially constant for a wide range of IF amplifier input voltage amplitudes $|V_{11}|$.

The AGC-D circuit 66 provides more delay than does AGC circuit 64, and works to hold $|V_{12}|$ substantially constant for wide variations in $|V_{10}|$, the radio signal strength at the input to the receiver.

Logarithmic function generators 68 and 70 operate on the output signals from the AGC circuit 64 and AGC-D circuit 66, respectively. The output signals from the generators 68 and 70 are summed by the summing circuit 72. The summing-circuit output current $I_{74}$, indicated by arrow 74, is thus the sum of two signals that are respectively proportional to the gains of the RF section (RF amplifier 52 and mixer 56) and the IF amplifier section. The overall gain of the receiver is a direct function of the product of these two receiver-section gains. Thus the radio-signal-strength indicating signal $I_{74}$ is a logarithmic function of the amplitude of the receiver input $|V_{10}|$, in a receiver having two AGC circuits that separately control the gains of different ones of the radio-signal processing portions of the receiver.

It is preferred to implement the signal-strength indicator portions in the radio of FIG. 4 as is indicated by the circuit of FIG. 5. Constant bias currents $I_{79}$ and $I_{81}$ are established at the inputs, respectively, of current mirrors 78 and 80. Current mirror circuit 78 has an input current that is the difference between currents $I_{79}$ and $I_{82}$. Current mirror circuit 80 has an input current that is the difference between $I_{81}$ and $I_{84}$. The bias currents $I_{79}$ and $I_{81}$ are determined by resistors 79 and 81, respectively. Currents $I_{82}$ and $I_{84}$ cause mirror output currents $I_{86}$ and $I_{88}$ to flow in the LN function generators 70 and 68. Currents $I_{86}$ and $I_{88}$ are advantageously made to increase when the radio signal increases. A reference current of constant value $I_{90}$ reflects as output current $I_{92}$ in current mirror generator 93. The current $I_{86}$, $I_{92}$ and $I_{88}$ flow respectively through PN junction diodes 94, 96 and 98. Two operational amplifiers 100 and 102 having the same gains amplify the difference between the voltage drops across diodes 94 and 96 and across diodes 94 and 96 respectively. The outputs of amplifiers 100 and 102 are summed by the network of resistors 108 and 110 which drives the meter 75.

Referring now to FIG. 6, the circuit shown there represents an integrated circuit realization of the portion of the radio receiver diagrammed in FIG. 5.

The diode loads 94, 96, and 98 are each two series connected diodes in FIG. 6. More generally each load is a string of diodes through which an AGC control current passes to produce a voltage that is a logarithmic function thereof dropped across the diode string. Transistors 114 and 116 with resistor 118 are connected to form the operational amplifier 100, while transistors 120 and 116 with resistor 122 from the operational amplifier 102. Fixed bias current generators 126, 128, 130, and 94 provide balanced bias currents (e.g. $I_B$ and $2I_B$). Their value is set by design to provide the same bias current density in all the diode strings PN junctions and in the base emitter junction operational amplifier transistors 114, 116 and 120. The current $2I_B$ established by current generator 93 is the reference current $I_{90}$ in FIG. 5.

The active load for the operational amplifiers 100 and 102 includes PNP transistors 132, 134 and 136 plus resistors 138 and 140. The output current $I_{142}$ therefrom is the input current to the current mirror circuit made up of transistors 144, 146 and 148 plus resistors 150 and 152. The output current is $I_{74}$ which in FIG. 5 drives meter 75, here in FIG. 6 more generally shown as a resistor 154. The drop across the resistive load 154 produces an output voltage $V_0$ at terminal 156.

Figure 7:
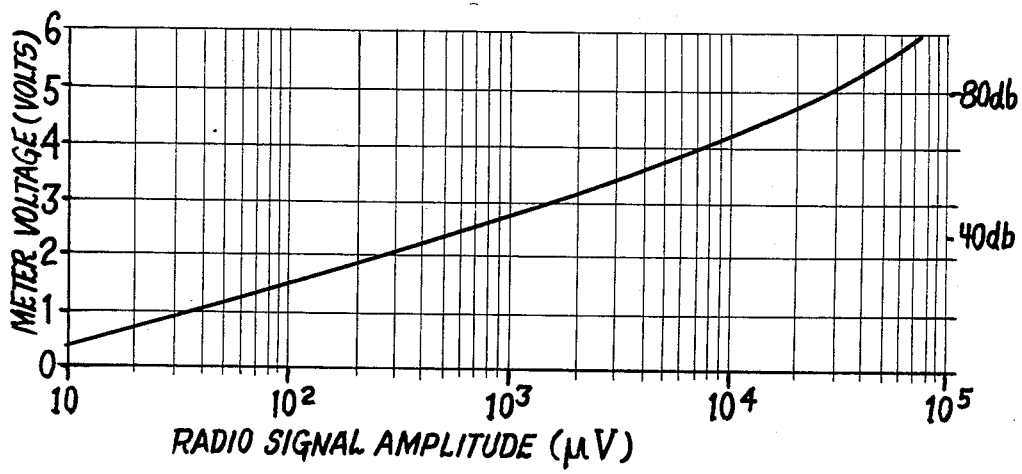
FIG. 7 shows a graph of the radio signal indicating output voltage from the circuit in FIG. 6 as a function of the radio input signal amplitude.

The radio of FIGS. 5 and 6 was built and tested. The graph in FIG. 7 shows that the amplitude of the meter voltage or more generally the output voltage at terminal 156 of the radio signal indicating portion as plotted on semi-log paper is essentially linear over about 4 decades of radio signal amplitudes. Furthermore, over the three decades between 30 and 30,000 microvolts at the input to the radio, this plot shows a linearity within about 5 percent.

What is claimed is:

1. A superheterodyne radio receiver comprising an RF section; an IF amplifier; a detector means for producing an intermediate control signal having a level that is proportional to the amplitude of the output signal from said IF amplifier, said RF section, said IF amplifier and said detector means being connected in tandem; a first automatic gain control (AGC) circuit having an input connected to the output of said detector means and having an output connected to a control point in said IF amplifier to produce there a first AGC control signal to hold substantially constant said amplitude of said IF amplifier output signal when the input signal to said IF amplifier varies, said first AGC circuit including a constant bias generator and a summing means for producing a signal that is the difference between the bias level from said constant bias generator and said intermediate control signal, and wherein said bias level, intermediate control signal and difference signal are currents, and wherein said first AGC circuit additionally includes a current mirror circuit having an input connected to the output of said summing means; and a first logarithmic function generator having an input connected to said first AGC circuit output for producing at the output of said first logarithmic function generator a first radio signal-amplitude indicating signal that is essentially the logarithm of said first AGC control signal, said current mirror circuit having an output connected to said IF amplifier control point and another output connected to said first logarithmic function generator input, so that said difference signal current and said two output currents from said current mirror are proportional to each other.

2. A radio receiver of claim 1 wherein the gain of said IF amplifier is essentially a linear positive function of said first AGC circuit output signal so that said first radio-signal-amplitude indicating signal varies as the logarithm of said IF amplifier gain.

3. The superheterodyne receiver of claim 1 wherein said logarithmic function generator is a PN-junction diode load connected to said another output of said current mirror circuit and an amplifier means for amplifying the voltage dropped across said diode load for producing said indicating signal.

4. The radio signal of claim 1 additionally comprising a second automatic gain control (AGC) circuit having an input connected to the output of said detector means and having an output connected to a control point in said RF section for producing there a second AGC control signal to hold substantially constant said amplitude of said IF amplifier output signal when the radio input signal to said RF section varies; and a second logarithmic function generator having an input connected to said second AGC circuit output for producing at the output of said second logarithmic function generator a second radio-signal-amplitude indicating signal that is essentially a logarithm of said second AGC control signal.

5. The radio receiver of claim 4 additionally comprising a summing means for producing a signal that is the sum of said first and second radio-signal-amplitude indicating signals, that is a logarithmic function of said input radio signal.

6. A radio receiver comprising:
  (a) a plurality of tandem-connected amplifier portions for amplifying a received radio signal appearing at the input of said receiver;
  (b) an AM detector being connected to the output of said tandem-connected amplifier portions;
  (c) a plurality of AGC circuit means each having an input connected to the output of said AM detector for producing respectively a plurality of control signals each at a separate one of said tandem connected amplifier portions to alter the gain of said separate one amplifier portion to maintain substantially constant the level of the output signal from said detector;

(d) a plurality of logarithmic function generators each respectively having an input signal that is proportional to one of said AGC control signals; and (e) a summing network means for summing the output signals from said plurality of logarithmic function generators to produce a sum signal, so that the amplitude of said sum signal is essentially a logarithmic function of the product of said gains of said tandemly connected amplifier portions and thus is also essentially a logarithmic function of the amplitude of said radio input signal.

7. A superheterodyne radio receiver comprising an RF section, an IF amplifier; a detector means for producing an intermediate control signal having a level that varies linearly with the amplitude of the output signal from said IF amplifier, said IF section, said IF amplifier and said detector means being connected in tandem; a first automatic gain control (AGC) circuit for producing a first AGC control current in said IF amplifier to hold substantially constant said amplitude of said IF amplifier output signal when the input signal to said IF amplifier varies; a second automatic gain control (AGC) circuit for producing a second AGC control current in said RF section to hold substantially constant said IF amplifier output signal when the input radio signal to said RF section varies, the inputs of said AGC circuits being connected to said detector means;

a first string of at least one PN junction diodes; a first means for directing a current proportional to said first control current through said first string in the forward diode direction;

a second string of at least on PN junction diodes; a second means for directing a current proportional to said second control current through said second string in the forward diode direction;

a third string of at least one PN junction diodes a source of constant reference current; a third means for directing said constant current through said third string in the forward diode direction;

a first differential amplifier means for generating a first voltage that is proportional to the difference between the voltage drops across said first and third strings, respectively;

a second differential amplifier means for generating a second voltage that is proportional to the difference between the voltage drops across said second and third strings, respectively;

a summing means for generating a radio-signal-amplitude indicating signal that is proportional to the sum of said first and second voltages and is a logarithmic function of said input radio signal.

* * * * *